(12) United States Patent
Liu et al.

(10) Patent No.: US 11,296,309 B2
(45) Date of Patent: Apr. 5, 2022

(54) METHOD OF MANUFACTURING SAME DISPLAY PANEL HAVING BENDING REGION OF POLYMIDE FILM HAVING DIFFERENT THICKNESS THAN IN OTHER REGIONS

(71) Applicant: WUHAN CHINA STAR OPTOELECTRONICS SEMICONDUCTOR DISPLAY TECHNOLOGY CO., LTD., Wuhan (CN)

(72) Inventors: Wanting Liu, Wuhan (CN); Ying Zheng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 225 days.

(21) Appl. No.: 16/624,075

(22) PCT Filed: Oct. 31, 2019

(86) PCT No.: PCT/CN2019/114790
§ 371 (c)(1),
(2) Date: Dec. 18, 2019

(87) PCT Pub. No.: WO2021/003900
PCT Pub. Date: Jan. 14, 2021

(65) Prior Publication Data
US 2021/0296412 A1 Sep. 23, 2021

(30) Foreign Application Priority Data

Jul. 5, 2019 (CN) .......................... 201910603357.1

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3244* (2013.01); *H01L 2227/323* (2013.01); *H01L 2251/5338* (2013.01)

(58) Field of Classification Search
CPC . H01L 27/3244; H01L 51/56; H01L 51/0097; H01L 2251/5338
See application file for complete search history.

(56) References Cited

U.S. PATENT DOCUMENTS 9,430,072 B2 8/2016 Lin et al.
2002/0139981 A1 10/2002 Young
(Continued)

FOREIGN PATENT DOCUMENTS

CN 1460299 A 12/2003
CN 1789007 A 6/2006
(Continued)

*Primary Examiner* — Michael Jung
(74) *Attorney, Agent, or Firm* — Osha Bergman Watanabe & Bergman LLP

(57) ABSTRACT

A display panel and a method of manufacturing the same are provided. The method includes steps of: providing a glass substrate, defining a bending region on the glass substrate, and providing a patterned organic photoresist in the bending region; etching a region of the glass substrate not covered by the patterned organic photoresist to form a patterned glass substrate, and to form a protrusion in the bending region; providing a first polyimide film on the patterned glass substrate, wherein a thickness of the first polyimide film in the bending region is less than a thickness of the first polyimide film in other regions.

16 Claims, 4 Drawing Sheets

(56) References Cited

U.S. PATENT DOCUMENTS

| | | | |
|---|---|---|---|
| 2011/0159689 A1 | 6/2011 | Kim | |
| 2018/0034002 A1* | 2/2018 | Kim | H01L 51/5253 |
| 2018/0088390 A1* | 3/2018 | Ohara | H01L 27/3276 |
| 2018/0138431 A1* | 5/2018 | Nishimura | H01L 51/0097 |
| 2018/0210266 A1* | 7/2018 | Lius | G02F 1/1347 |
| 2018/0219164 A1 | 8/2018 | Xu | |
| 2019/0067387 A1* | 2/2019 | Chen | G02F 1/133308 |
| 2019/0189975 A1* | 6/2019 | Lim | H01L 29/78633 |
| 2019/0212781 A1* | 7/2019 | Fujimoto | G06F 1/1641 |
| 2019/0305235 A1* | 10/2019 | Hsieh | H01L 51/52 |
| 2019/0372051 A1* | 12/2019 | Kwon | H01L 51/0097 |
| 2020/0119131 A1* | 4/2020 | Ohara | H01L 51/50 |
| 2020/0235139 A1 | 7/2020 | Ke | |
| 2020/0310493 A1* | 10/2020 | Kim | G06F 1/1609 |

FOREIGN PATENT DOCUMENTS

| | | |
|---|---|---|
| CN | 106340523 A | 1/2017 |
| CN | 106784311 A | 5/2017 |
| CN | 109659318 A | 4/2019 |

\* cited by examiner

METHOD OF MANUFACTURING SAME DISPLAY PANEL HAVING BENDING REGION OF POLYIMIDE FILM HAVING DIFFERENT THICKNESS THAN IN OTHER REGIONS

FIELD OF INVENTION

The present disclosure relates to display technologies, and more particularly, to a display panel and a method of manufacturing the same.

BACKGROUND OF INVENTION

With continuous advancement of technology, flexible display has become a trend. A most important part of the flexible display is a flexible substrate. Polyimide material is widely used as a flexible substrate due to its excellent thermal properties, mechanical properties and stability. It is wildly used in preparation of flexible organic light emitting diodes.

However, after thin film transistors are prepared on the polyimide substrate, because the polyimide substrate has a thick film thickness and has a long distance from a metal trace above it, a neutral layer of the bending region is biased toward the polyimide substrate. It causes a metal layer to be subjected to a large stress, thereby causes the metal trace breakage or cracking. Display effect is affected therefore.

Therefore, there is a need to solve the above issues.

SUMMARY OF INVENTION

In view of the above, the present disclosure provides a display panel and a method of manufacturing the same to resolve technical issues that the polyimide substrate has a thick film thickness and has a long distance from a metal trace above it, a neutral layer of the bending region is biased toward the polyimide substrate, a metal layer is subjected to a large stress, thereby causing the metal trace breakage or cracking, and display effect is affected therefore.

In order to achieve above-mentioned object of the present disclosure, one embodiment of the disclosure provides a method of manufacturing a display panel including steps of:

S10: providing a glass substrate, defining a bending region on the glass substrate, and providing a patterned organic photoresist in the bending region;

S20: after providing a protecting film on a surface of the glass substrate opposite to another surface of the glass substrate facing the organic photoresist, etching a region of the glass substrate not covered by the patterned organic photoresist to form a patterned glass substrate, and to form a protrusion in the bending region;

S30: removing the patterned organic photoresist;

S40: providing a first polyimide film on the patterned glass substrate, wherein a thickness of the first polyimide film in the bending region is less than a thickness of the first polyimide film in other regions, and a surface of the first polyimide film opposite to another surface of the first polyimide film facing the glass substrate is a flattening surface;

S50: providing a thin film transistor array and a light emitting layer on the first polyimide film sequentially; and S60: peeling the glass substrate.

In one embodiment of the disclosure, the method of manufacturing the display panel further includes a step of: removing the protecting film before the step S30.

In one embodiment of the disclosure, the step S20 further includes a step of: etching the glass substrate by hydrofluoric acid solution to form a protrusive strip in the bending region.

In one embodiment of the disclosure, the method of manufacturing the display panel further includes steps of: providing a barrier layer on the first polyimide film, and providing a second polyimide film on the barrier layer before the step S50.

In one embodiment of the disclosure, the step S50 further includes steps of: providing the thin film transistor array on the second polyimide film, and providing the light emitting layer on the thin film transistor array.

In one embodiment of the disclosure, a uniformity of an etching rate in the step S20 is less than 10%.

In one embodiment of the disclosure, the step S40 further includes:

coating polyamic acid solution on the glass substrate;

baking at low temperature to remove organic solvent; and raising temperature and dehydrating to enable a thermal imidization reaction to obtain the first polyimide film.

Furthermore, another embodiment of the disclosure provides a method of manufacturing a display panel including steps of:

S10: providing a glass substrate, defining a bending region on the glass substrate, and providing a patterned organic photoresist in the bending region;

S20: etching a region of the glass substrate not covered by the patterned organic photoresist to form a patterned glass substrate, and to form a protrusion in the bending region;

S30: removing the patterned organic photoresist;

S40: providing a first polyimide film on the patterned glass substrate, wherein a thickness of the first polyimide film in the bending region is less than a thickness of the first polyimide film in other regions;

S50: providing a thin film transistor array and a light emitting layer on the first polyimide film sequentially; and S60: peeling the glass substrate.

In one embodiment of the disclosure, the method of manufacturing the display panel further includes a step of: providing a protecting film on a surface of the glass substrate opposite to another surface of the glass substrate facing the organic photoresist before the step S20.

In one embodiment of the disclosure, the method of manufacturing the display panel further includes a step of: removing the protecting film before the step S30.

In one embodiment of the disclosure, the step S20 further includes a step of: etching the glass substrate by hydrofluoric acid solution to form a protrusive strip in the bending region.

In one embodiment of the disclosure, the method of manufacturing the display panel further includes steps of: providing a barrier layer on the first polyimide film, and providing a second polyimide film on the barrier layer before the step S50.

In one embodiment of the disclosure, the step S50 further includes steps of: providing the thin film transistor array on the second polyimide film, and providing the light emitting layer on the thin film transistor array.

In one embodiment of the disclosure, a surface of the first polyimide film opposite to another surface of the first polyimide film facing the glass substrate is a flattening surface.

In one embodiment of the disclosure, a uniformity of an etching rate in the step S20 is less than 10%

In one embodiment of the disclosure, the step S40 further includes:

coating polyamic acid solution on the glass substrate;

baking at low temperature to remove organic solvent; and raising temperature and dehydrating to enable a thermal imidization reaction to obtain the first polyimide film.

Furthermore, another embodiment of the disclosure provides a display panel including a bending region defined thereon and provided by the method abovementioned, including a first polyimide film, a thin film transistor array disposed on the first polyimide film, and a light emitting layer disposed on the thin film transistor array. A thickness of the first polyimide film in the bending region is less than a thickness of the first polyimide film in other regions.

In comparison with prior art, the display panel and the method of manufacturing the same of the disclosure the patterned glass substrate with a thicker thickness at the bending region. A thickness of the polyimide film at the bending area is thinner when the polyimide film is providing on the glass substrate. Stress of metal trace is reduced when bending therefore, and risk of metal trace breakage or cracking is avoided.

BRIEF DESCRIPTION OF DRAWINGS

In order to more clearly illustrate embodiments or technical solutions in prior art, drawings to be used in description of the embodiments or the prior art will be briefly described below. Obviously, the drawings in the following description are merely some embodiments of the invention. Considering the drawings, other drawings may be obtained by those of ordinary skill in the art without creative effort.

DETAILED DESCRIPTION OF PREFERRED EMBODIMENTS

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

In comparison with prior art, the display panel and the method of manufacturing the same of the disclosure pattern the glass substrate with a thicker thickness at the bending region. A thickness of the polyimide film at the bending area is thinner when the polyimide film is providing on the glass substrate. Stress of metal trace is reduced when bending therefore, and risk of metal trace breakage or cracking and affection of display effect is avoided.

Figure 8:
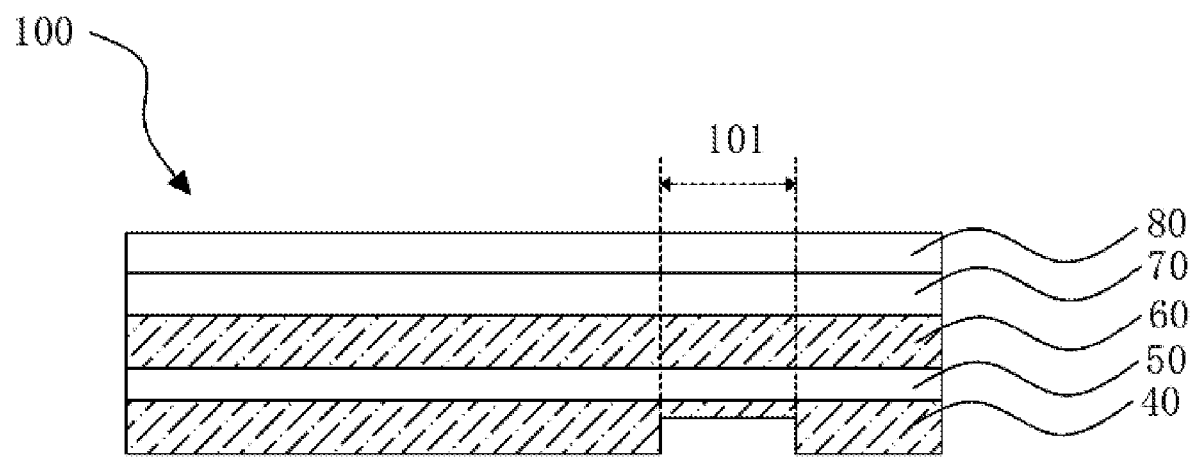
FIG. 8 is a schematic view of a structure of a display panel after peeling the glass substrate according to an embodiment of the present disclosure.

Referring to FIG. 8, one embodiment of the disclosure provides a display panel 100 including a first polyimide film 40, a thin film transistor array 70 disposed on the first polyimide film 40, and a light emitting layer 80 disposed on the thin film transistor array 70. Polyimide material is widely used as a flexible substrate due to its excellent thermal properties, mechanical properties and stability. However, because the polyimide substrate has a thick film thickness, a neutral layer is biased toward the polyimide substrate when the substrate is bending. It causes a metal layer to be subjected to a large stress, thereby causes the metal trace breakage. The disclosure resolves the abovementioned technical issue.

The display panel 100 provides a defined bending region 101. A thickness of the first polyimide film 40 in the bending region 101 is less than a thickness of the first polyimide film 40 in other regions. With a thinner thickness of the polyimide film at the bending area, the neutral layer is biased toward the metal layer on the thin film transistor array 70, therefore stress of metal trace is reduced, and risk of metal trace breakage is avoided.

Figure 1:
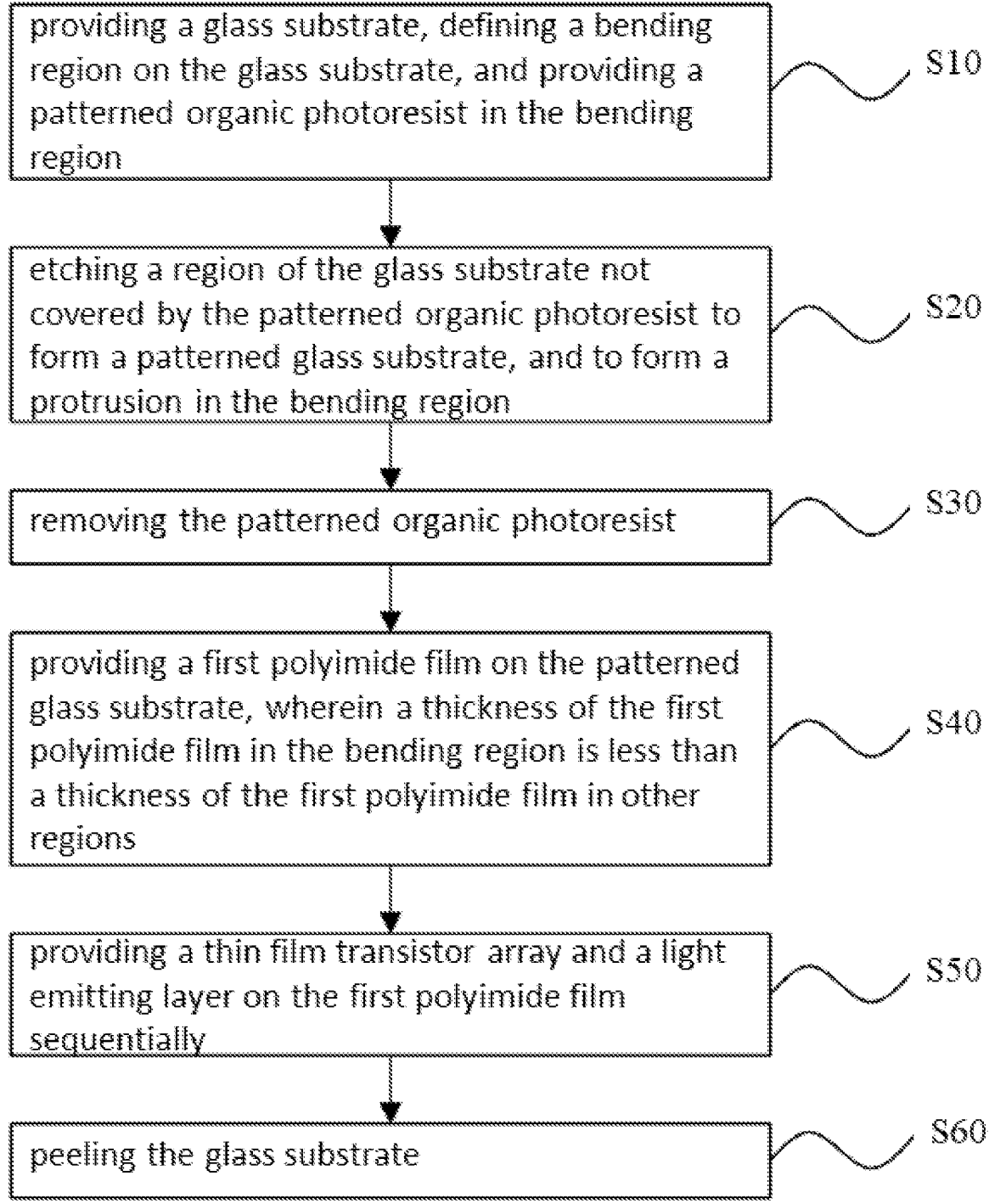
FIG. 1 is a schematic flowchart of a method of manufacturing a display panel according to an embodiment of the present disclosure.

In order to achieve above-mentioned object of the present disclosure, one embodiment of the disclosure provides a method of manufacturing a display panel including steps of:

As shown in FIG. 1, a step S10 includes: providing a glass substrate 10, defining a bending region 101 on the glass substrate 10, and providing a patterned organic photoresist 20 in the bending region 101.

Figure 2:
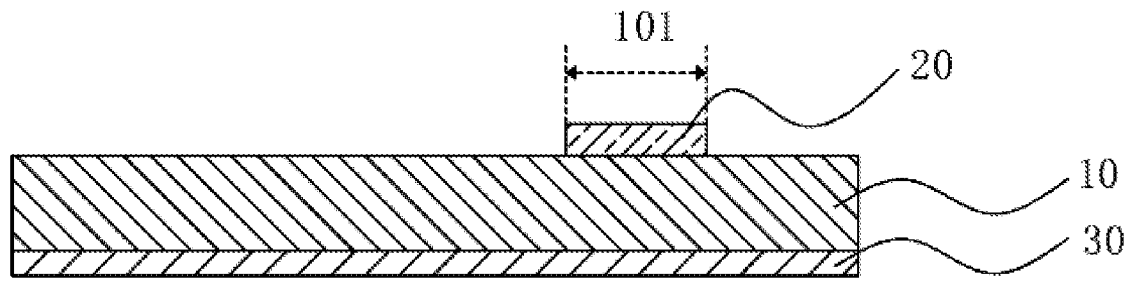
FIG. 2 is a schematic view of a structure of a patterned organic photoresist according to an embodiment of the present disclosure.

As shown in FIG. 2, steps include coating the organic photoresist on the glass substrate 10, exposing the organic photoresist under a special mask, developing and clearing the organic photoresist to reserve the organic photoresist within the bending region 101. That is, forming a patterned organic photoresist 20 within the bending region 101.

Figure 3:
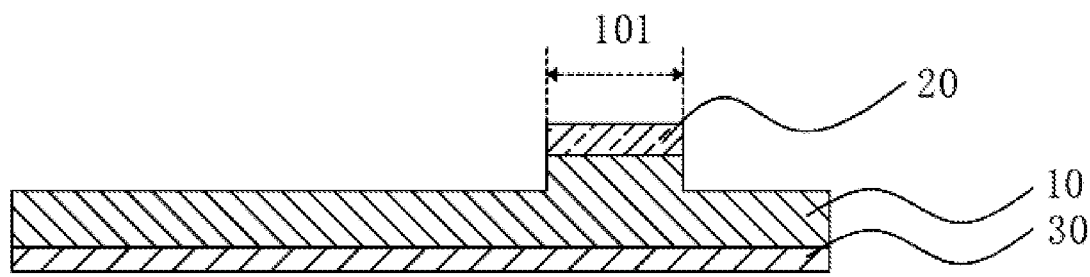
FIG. 3 is a schematic view of a structure of a glass substrate after etching according to an embodiment of the present disclosure.
Figure 4:
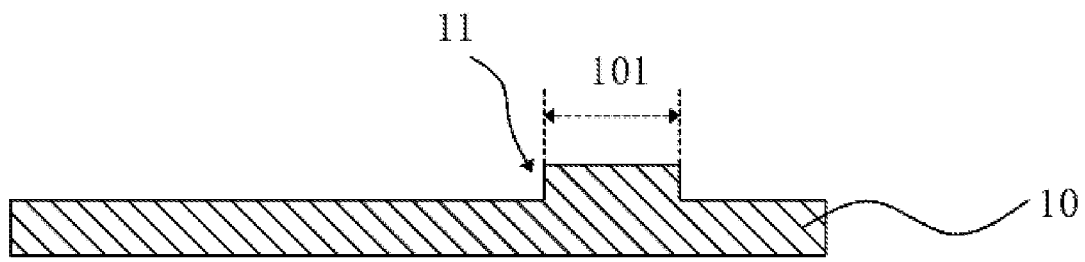
FIG. 4 is a schematic view of a structure of a glass substrate after removing the organic photoresist according to an embodiment of the present disclosure.
Figure 5:
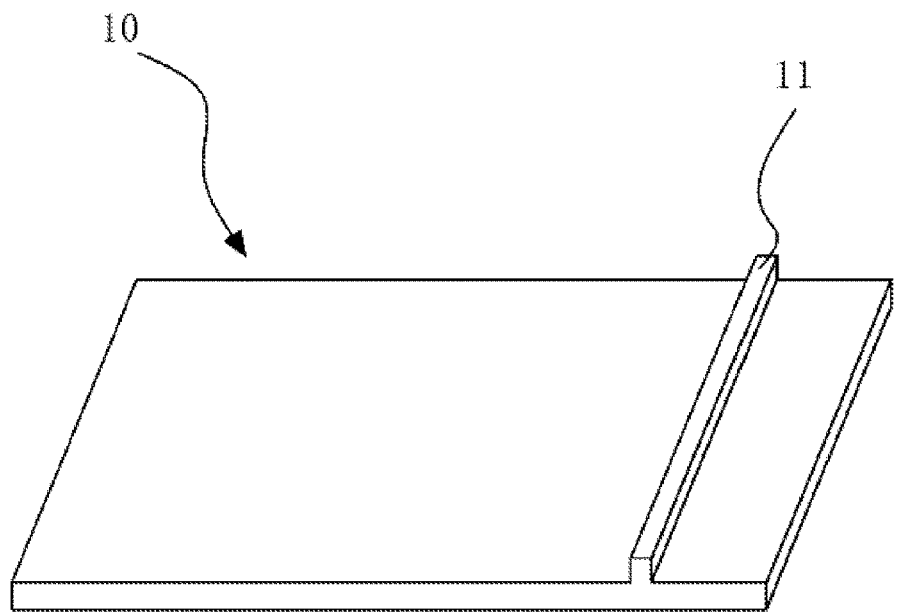
FIG. 5 is another schematic view of a structure of a glass substrate after removing the organic photoresist according to an embodiment of the present disclosure.

As shown in FIG. 3 to FIG. 5, a step S20 includes: etching a region of the glass substrate 10 not covered by the patterned organic photoresist to form a patterned glass substrate 10, and to form a protrusion 11 in the bending region 101.

In detail, before etching the glass substrate 10, the method includes: providing a protecting film 30 on a surface (backside) of the glass substrate 10 opposite to another surface of the glass substrate 10 facing the organic photoresist 20 to protect the backside of the glass substrate 10. The protecting film 30 is made of a material includes a polyethylene film. A polyethylene film is directly attached to the whole backside of the glass substrate 10.

Then, the method includes: etching the glass substrate 10 by hydrofluoric acid solution to form a patterned glass substrate 10. In detail, the method includes: dipping the glass substrate 10 in the hydrofluoric acid solution and rinsing. The hydrofluoric acid solution only etches glass and does not react with organic photoresist material, therefore the glass substrate 10 covered by the organic photoresist 20 won't be etching, and a region of the glass substrate 10 outside the bending region 101 is etching to form a protrusion 11 in the bending region 101 of the glass substrate 10. A purpose of thinning the film at the bending region when preparing the polyimide film is achieved by a difference of film height of different regions of the glass substrate 10.

A shape of the protrusion 11 is a strip shape or a trapezoid shape, the disclosure is not limited about this.

In an etching process, a preset film thickness is achieved by maintaining a uniformity U % of an etching rate. Generally, the smaller the uniformity value U %, the better the etching uniformity. The uniformity of the etching rate of an embodiment in the disclosure is less than 5%

The step S30 includes: removing the patterned organic photoresist.

The method includes: removing the protecting film 30 on the glass substrate 10 before removing the organic photoresist 20 by organic solvent.

Figure 6:
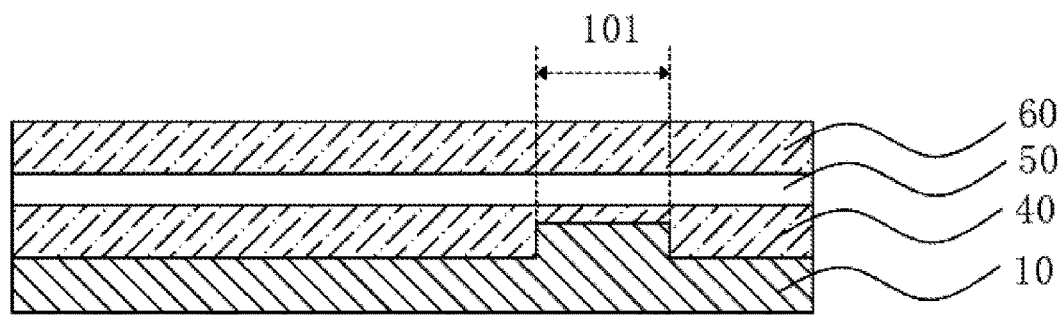
FIG. 6 is a schematic view of a structure of a second polyimide film according to an embodiment of the present disclosure.

As shown in FIG. 6, the step S40 includes: providing a first polyimide film 40 on the patterned glass substrate 10, wherein a thickness of the first polyimide film 40 in the bending region 101 is less than a thickness of the first polyimide film 40 in other regions.

In detail, the method includes: uniformly coating polyamic acid solution on the patterned glass substrate 10, baking to form a film at low temperature to remove organic solvent, and raising temperature and dehydrating to enable a thermal imidization reaction to obtain the first polyimide film 40 under high-purity nitrogen atmosphere.

Because the first polyimide film 40 is used as a substrate, it is required to provide a smooth surface for a subsequently prepared device, and therefore, it is necessary to ensure obtainment of a first polyimide film 40 with a flattening surface after solution coating and film formation process.

In addition, because the first polyimide film 40 is formed on a surface of the glass substrate 10 having the protrusion 11, a surface on a side of the first polyimide film 40 adjacent to the glass substrate 10 is correspondingly formed with a groove, and the groove is formed in the bending region 101, thereby causing a film thickness of the first polyimide film 40 in the bending region 101 is smaller than a film thickness of the first polyimide film 40 in other regions.

Based on this embodiment, a multilayer polyimide film can be prepared to enhance the reliability of the substrate film. For example, based on this embodiment, the method includes: providing a barrier layer 50 on the first polyimide film 40, and providing a second polyimide film 60 on the barrier layer 50.

A preparation method of the second polyimide film 60 may refer to the preparation method of the first polyimide film 40, which will not be described herein.

Figure 7:
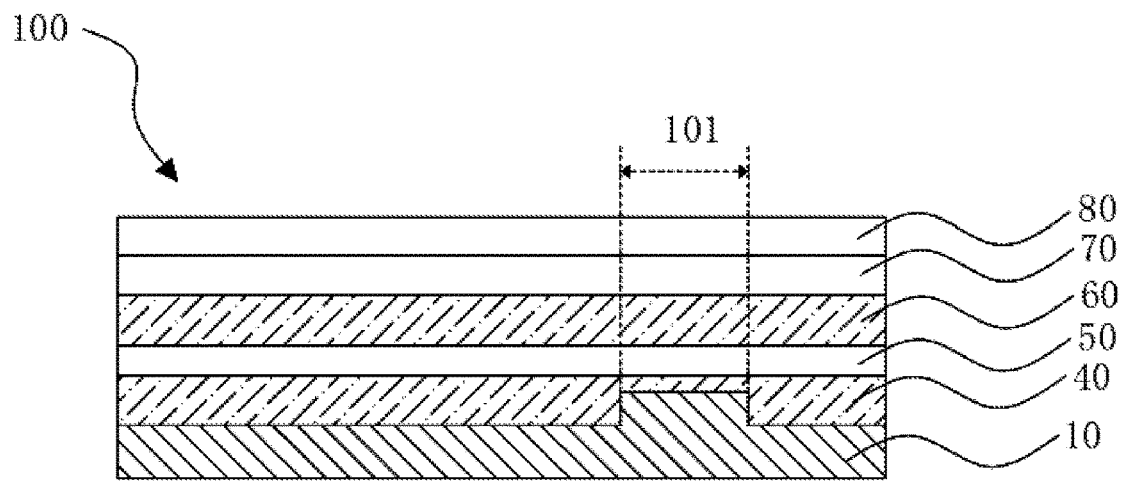
FIG. 7 is a schematic view of a structure of a display panel before peeling the glass substrate according to an embodiment of the present disclosure.

As shown in FIG. 7, the step S50 includes: providing a thin film transistor array 70 and a light emitting layer 80 on the first polyimide film 40 sequentially.

In detail, when using a substrate with two layers of polyimide films, the thin film transistor array 70 is provided on the second polyimide film 60. The thin film transistor array 70 includes an active layer, a source electrode, a drain electrode, a gate electrode, and a metal device such as a surrounding trace.

The light emitting layer 80 is an OLED layer including an anode, a hole injection layer, a hole transporting layer, a luminescent material layer, an electron transporting layer, an electron injection layer, a cathode, and the like.

As shown in FIG. 8, the step S60 includes: peeling the glass substrate 10.

The glass substrate 10 can be peeled off from the first polyimide film 40 by a laser lift-off technique.

In comparison with prior art, the display panel and the method of manufacturing the same of the disclosure the patterned glass substrate with a thicker thickness at the bending region. A thickness of the polyimide film at the bending area is thinner when the polyimide film is providing on the glass substrate. Stress of metal trace is reduced when bending therefore, and risk of metal trace breakage or cracking is avoided.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A method of manufacturing a display panel, comprising steps of:
    S10: providing a glass substrate, defining a bending region on the glass substrate, and providing a patterned organic photoresist in the bending region;
    S20: after providing a protecting film on a surface of the glass substrate opposite to another surface of the glass substrate facing the organic photoresist, etching a region of the glass substrate not covered by the patterned organic photoresist to form a patterned glass substrate, and to form a protrusion in the bending region;
    S30: removing the patterned organic photoresist;
    S40: providing a first polyimide film on the patterned glass substrate, wherein a thickness of the first polyimide film in the bending region is less than a thickness of the first polyimide film in other regions, and a surface of the first polyimide film opposite to another surface of the first polyimide film facing the glass substrate is a flattening surface;
    S50: providing a thin film transistor array and a light emitting layer on the first polyimide film sequentially; and
    S60: peeling the glass substrate.

2. The method of manufacturing the display panel according to claim 1, further comprising a step of: removing the protecting film before the step S30.

3. The method of manufacturing the display panel according to claim 1, wherein the step S20 further comprises a step of: etching the glass substrate by hydrofluoric acid solution to form a protrusive strip in the bending region.

4. The method of manufacturing the display panel according to claim 1, further comprising steps of: providing a barrier layer on the first polyimide film, and providing a second polyimide film on the barrier layer before the step S50.

5. The method of manufacturing the display panel according to claim 4, wherein the step S50 further comprises steps of: providing the thin film transistor array on the second polyimide film, and providing the light emitting layer on the thin film transistor array.

6. The method of manufacturing the display panel according to claim 1, wherein a uniformity of an etching rate in the step S20 is less than 10%.

7. The method of manufacturing the display panel according to claim 1, wherein the step S40 further comprises:
    coating polyamic acid solution on the glass substrate;
    baking at low temperature to remove organic solvent; and
    raising temperature and dehydrating to enable a thermal imidization reaction to obtain the first polyimide film.

8. A method of manufacturing a display panel, comprising steps of:
    S10: providing a glass substrate, defining a bending region on the glass substrate, and providing a patterned organic photoresist in the bending region;

S20: etching a region of the glass substrate not covered by the patterned organic photoresist to form a patterned glass substrate, and to form a protrusion in the bending region;

S30: removing the patterned organic photoresist;

S40: providing a first polyimide film on the patterned glass substrate, wherein a thickness of the first polyimide film in the bending region is less than a thickness of the first polyimide film in other regions;

S50: providing a thin film transistor array and a light emitting layer on the first polyimide film sequentially; and S60: peeling the glass substrate.

9. The method of manufacturing the display panel according to claim 8, further comprising a step of: providing a protecting film on a surface of the glass substrate opposite to another surface of the glass substrate facing the organic photoresist before the step S20.

10. The method of manufacturing the display panel according to claim 9, further comprising a step of: removing the protecting film before the step S30.

11. The method of manufacturing the display panel according to claim 8, wherein the step S20 further comprises a step of: etching the glass substrate by hydrofluoric acid solution to form a protrusive strip in the bending region.

12. The method of manufacturing the display panel according to claim 8, further comprising steps of: providing a barrier layer on the first polyimide film, and providing a second polyimide film on the barrier layer before the step S50.

13. The method of manufacturing the display panel according to claim 12, wherein the step S50 further comprises steps of: providing the thin film transistor array on the second polyimide film, and providing the light emitting layer on the thin film transistor array.

14. The method of manufacturing the display panel according to claim 8, wherein a surface of the first polyimide film opposite to another surface of the first polyimide film facing the glass substrate is a flattening surface.

15. The method of manufacturing the display panel according to claim 8, wherein a uniformity of an etching rate in the step S20 is less than 10%.

16. The method of manufacturing the display panel according to claim 8, wherein the step S40 further comprises:

coating polyamic acid solution on the glass substrate;

baking at low temperature to remove organic solvent; and raising temperature and dehydrating to enable a thermal imidization reaction to obtain the first polyimide film.

\* \* \* \* \*